United States Patent [19]

Omata et al.

[11] Patent Number: 4,854,004
[45] Date of Patent: Aug. 8, 1989

[54] DEVICE FOR CLEARING THE HOLE BLOCKAGE OF A LIQUID RESIST SUBSTRATE

[75] Inventors: Tadao Omata; Naoshi Kozu, both of Tokyo, Japan

[73] Assignee: ORC Manufacturing Co., Ltd., Tokyo, Japan

[21] Appl. No.: 138,159

[22] Filed: Dec. 28, 1987

[51] Int. Cl.⁴ .......................... B08B 5/02; B08B 5/04
[52] U.S. Cl. .................................. 15/304; 15/306 B; 15/345
[58] Field of Search ...................... 15/345, 304, 306 R, 15/306 B, 306 A, 346

[56] References Cited

U.S. PATENT DOCUMENTS

| | | | |
|---|---|---|---|
| 2,250,238 | 7/1941 | Smith | 15/306 B X |
| 3,421,211 | 1/1969 | Eaves et al. | 15/306 B X |
| 3,574,261 | 4/1971 | Bailey | 15/306 A X |
| 3,849,831 | 11/1974 | DeVerter et al. | 15/306 B X |
| 3,909,873 | 10/1975 | Minasov et al. | 15/306 B |
| 4,183,147 | 1/1980 | Kawaguchi | 15/345 X R |
| 4,198,725 | 4/1980 | Trutzeschler | 15/345 X R |
| 4,411,038 | 10/1983 | Mukai | 15/346 X |

FOREIGN PATENT DOCUMENTS 2794   1/1985   Japan ...................................... 15/346

*Primary Examiner*—Chris K. Moore
*Attorney, Agent, or Firm*—Cushman, Darby & Cushman

[57] ABSTRACT

Disclosed is a device for clearing the hole blockage of a liquid resist substrate. The liquid resist substrate has a substrate formed with holes and coated on its upper surface with a liquid resist. The device has a blowing-off means which is intended to blow off the portions of the liquid resist in the holes from the same to an upper surface side of the substrate, and a sucking-in means which is intended to suck in the portions of the liquid resist in the holes of the substrate, whereby the portions of the liquid resist in the holes of the substrate can be removed.

1 Claim, 2 Drawing Sheets

DEVICE FOR CLEARING THE HOLE BLOCKAGE OF A LIQUID RESIST SUBSTRATE

BACKGROUND OF THE INVENTION

1. Field of the Invention

The present invention relates to a liquid resist substrate having a punctured substrate coated on its surface with a liquid resist and, more particularly, to a device for clearing the hole blockage of a liquid resist substrate, which is adapted to clear away the portions of the liquid resist jammed in the holes of the liquid resist substrate.

2. Description of the Prior Art

Conventionally, in the process of manufacturing a print circuit substrate, etc., in which, for example, etching must be performed, a liquid resist substrate is more frequently employed for exposure-printing than a dry resist substrate because the former can make the exposure-printed image lines finer.

Hereinafter, the use of a conventional liquid resist substrate will be described with reference to the drawings.

As shown in FIG. 2, a liquid resist substrate 1 has a substrate 2 formed with hole portions 2a, the substrate 2 being coated, on its upper surface 2b, with a liquid resist 3 by means of, for example, a roller coater 4, and the liquid resist substrate 1 is conveyed up to a stationary board 7 of an exposure-printing apparatus 6 by means of, for example, a conveyor 5. The stationary board 7 is formed with adsorption bores 7a intended to adsorb the underside of the liquid resist substrate 1 to fix the same, the adsorption bores 7a being connected to a vacuum source 9 by way of a pipe unit 8. After the liquid resist substrate 1 has been fixed to the stationary board 7, a glass mask 10 which has an original image is made to come near to the liquid resist 3 of the liquid resist substrate 1 and thus is positioned so that the clearance between the glass mask 10 and the liquid resist 3 may be, for example, to an extent of 100 microns, whereby the exposure-printing is performed with use of parallel light rays 11. In the exposure-printing, the liquid resist 3 is so arranged that only the portions thereof which are irradiated with the parallel light rays 11 may be solidified. The liquid resist substrate 1 is conveyed to the exposure-printing apparatus 6 in a state wherein the liquid resist 3 is jammed in the hole portions 2a, and is adsorbed and fixed to the stationary board 7, whereby exposure-printing is conducted.

In the prior art, the liquid resist substrate 1 is adsorbed and fixed to the exposure-printing apparatus in a state wherein the hole portions thereof are blocked by the liquid resist, as stated above. This raises problems that the liquid resist of the hole portions attach onto the stationary board to make it difficult to move the liquid resist substrate away from the stationary board, and that the liquid resist is jammed in the adsorption bores of the stationary board to stop the liquid resist substrate from being adsorbed and fixed to the same. A further problem is that when the next liquid resist substrate is adsorbed and fixed to the stationary board with the liquid resist of a preceding substrate being kept attaching onto the stationary board, the exposure-printed image lines fails to become precise because the liquid resist substrate fails to be horizontal. A further problem is that when the liquid resists at the hole portions are irradiated thereon with parallel light rays, they are solidified to permit the liquid resist substrate to be secured onto the stationary board. These drawbacks make it necessary to frequently clean the stationary board and the like.

SUMMARY OF THE INVENTION

In view of the above, the present invention has been made to solve the above-mentioned problems inherent in the prior ar and its object is to provide a device for clearing the hole blockage of a liquid resist substrate, which prevents the liquid resists at the hole portions of the substrate from attaching onto the stationary board of an exposure-printing apparatus.

To attain the above object, according to the present invention, there is provided a device for clearing the hole blockage of a liquid resist substrate, the liquid resist substrate having a substrate formed with holes and coated on its upper surface with a liquid resist, the device comprising a blowing-off means for blowing off the portions of the liquid resist in the holes from the same to an upper surface side of the liquid resist substrate, and a sucking-in means for sucking in the portions of the liquid resist in the holes of the liquid resist substrate.

Since it has the described construction, the present invention has the following action. Firstly, the liquid resists at the hole portions of the liquid resist substrate are blown off from the hole portions thereof by means of the blowing-off means. Secondly, the liquid resists having been blown off from the hole portions are sucked in by means of the sucking-in means. Therefore, it is possible to remove the liquid resists at the hole portions of the liquid resist substrate.

DESCRIPTION OF THE PREFERRED EMBODIMENTS

Figure 1:
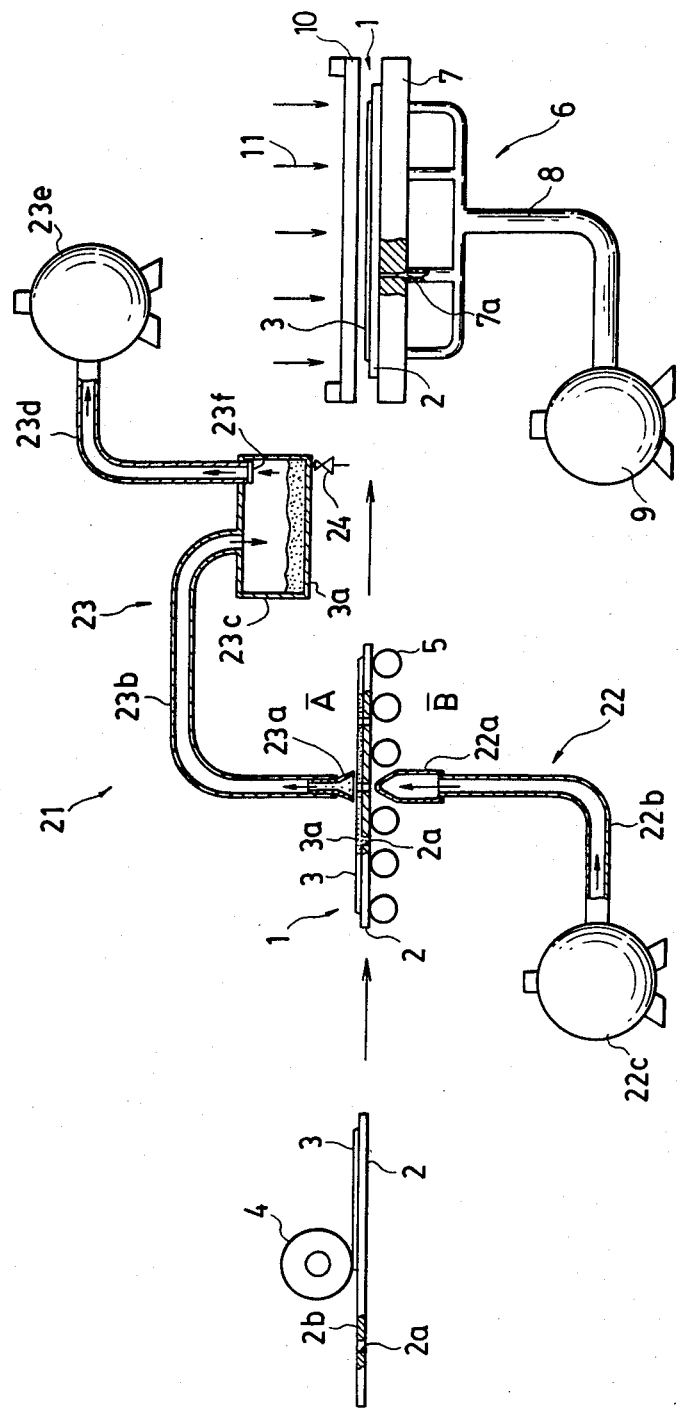
FIG. 1 is a schematic constructional illustration of a device for clearing the hole blockage of a liquid resist substrate in accordance with an embodiment of the present invention; and, FIG. 2 is a view illustrating a conventional device which is destitute of an arrangement for clearing the hole blockage of a liquid resist substrate.
Figure 2:
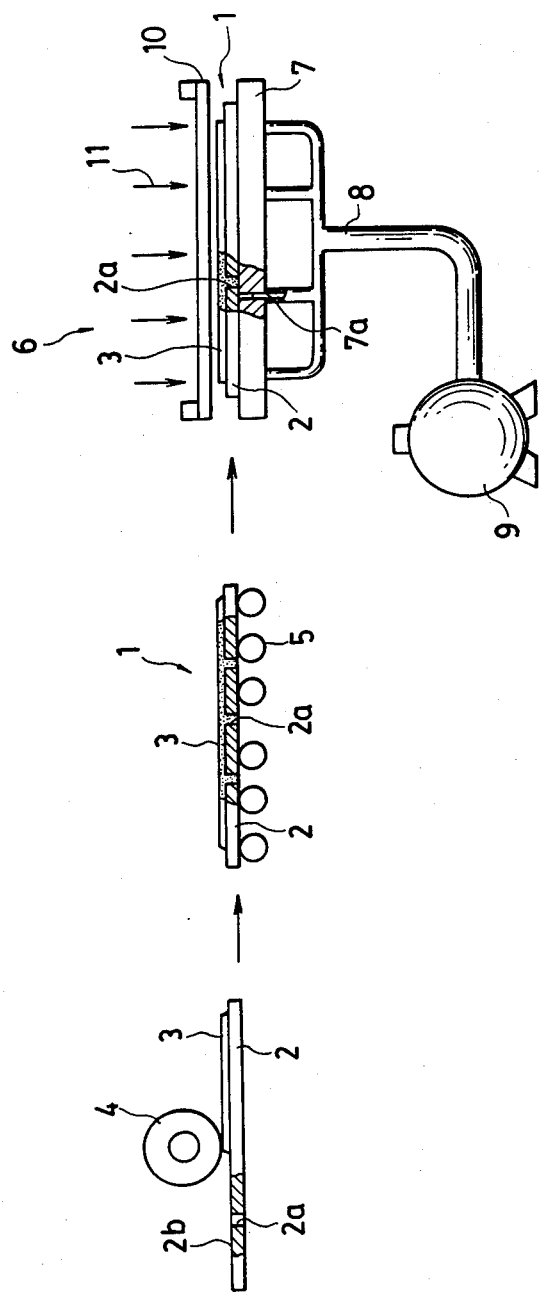

An embodiment of the present invention will now be described with reference to the drawings. FIG. 1 is a schematic constructional illustration of a device for clearing the hole blockage of a liquid resist substrate in accordance with the embodiment of the present invention. As shown in FIG. 1, a device 21 for clearing the hole blockage of a liquid resist substrate; the liquid resist substrate 1 having a substrate 2 provided with hole portions 2a and coated on its upper surface 2b with a liquid resist 3 by means of a roller coater 4, comprises a blowing-off means 22 which is intended to blowing off a liquid resist 3a at the hole portions 2a from these hole portions to an upper surface side $\overline{A}$ of the liquid resist substrate 1, and a sucking-in means 23 which is intended to suck in the liquid resists 3a at the hole portions 2a thus blown off.

The blowing-off means 22 is constructed such that it has an air-jetting nozzle member 22a provided at a lower surface side $\overline{B}$ of the liquid resist substrate 1, the air-jetting nozzle member 22a being connected to an air-outlet side of a turbofan 22c by way of a pipe 22b. The air which is sent over from the turbofan 22c is jetted onto the hole portions 2a by means of the air-jetting nozzle member 22a to thereby blow off the liquid resist 3a to be removed to the upper surface side $\overline{A}$ of the liquid resist substrate 1.

The sucking-in means 23 is composed of a sucking-in nozzle member 23a provided at the upper surface side $\overline{A}$ of the liquid resist substrate 1, a tank 23c and a turbofan 23e, the sucking-in nozzle member 23a being connected to the tank 23c by way of a pipe 23b, the tank 23c being connected to an air-inlet side of the turbofan 23e by way of a pipe 23d. The pipe 23d is disposed such that its one end projects inside the tank 23c. The one end of the pipe 23d at the side of the tank 23c is detachably provided with a filter 23f which permits the passage therethrough of air alone.

The liquid resist 3a which has been blown off from the hole portions 2a is sucked in from the sucking-in nozzle member together with air. Then, it is stopped by means of the filter 23f from being sucked into the turbofan 23e, staying within the tank 23c, whereby only the air is sucked into the turbofan 23e.

The tank 23c is provided with a valve 24. Therefore, when the amount of the liquid resist 3a having been removed becomes too large, it is permitted to flow outside the tank 23c by way of the valve 24. Further, since the filter 23f is detachably provided, it is possible to replace it by uncovering a lid not shown of the tank 23c.

The air-jetting nozzle member 22a and the sucking-in nozzle member 23a of the hole blockage clearing device 21 are provided with respect to the conveyor 5 for conveying the liquid resist substrate 1 to the stationary board 7 of the exposure-printing apparatus 6. For this reason, it is possible to remove the liquid resists 3a at the hole portions 2a while conveying the liquid resist substrate 1. The stationary board 7 is formed with adsorbing bores 7a for adsorbing the underside of the liquid resist substrate 1 to fix the same, the adsorbing bores 7a being connected to a vacuum source 9 by way of a pipe unit 8. After the liquid resist substrate 1 has been fixed to the stationary board 7, a glass mask 10 having an original image is made to come near to the liquid resist 3 of the liquid resist substrate 1 and is positioned such that the clearance between the glass mask 10 and the liquid resist 3 is to an extent of, for example, 100 microns. This prevents the glass mask 10 from adhering onto the liquid resist 3, whereby exposure-printing is conducted by irradiation of parallel light rays 11. The glass mask 10 may of course be a one which is prepared by retaining a mask film by means of glass or transparent resinous plate (acryl).

The present invention is not limited to the above-mentioned embodiment, but permits various applications and modifications to be made without departing from the spirit and scope of the invention. For instance, the conveyor may be substituted for by a handler. In this case, the blowing-off means and sucking-in means may be moved with the resist substrate being unmoved.

The present invention has the above-described construction and, therefore, provides the following advantages.

The blowing-off means for blowing off the liquid resist at the hole portions of the liquid resist substrate to the upper surface side of the same, and the sucking-in means for sucking in the liquid resist thus blown off, are provided, whereby the liquid resist can be removed to prevent the liquid resist at the hole portions from adhering onto the underside of the liquid resist substrate. This prevents the liquid resist at the hole portions from adhering onto the stationary board of an exposure-printing apparatus. This makes it easy to move the liquid resist substrate away from the stationary board and also prevents the liquid resist from being jammed in the adsorption bores of the stationary board. Further, since the liquid resist does not adhere onto the stationary board, even when the next liquid resist substrate is adsorbed and fixed to the stationary board, it can be fixed in a state of being kept horizontal. This makes the exposure-printed image lines more precise. Further, since the hole portions of the liquid resist substrate have no liquid resist, even when the substrate is irradiated with parallel light rays, it is impossible that the liquid resist substrate is secured to the stationary board. For the above-mentioned reasons, it is unnecessary to frequently clean the stationary board, etc.

What is claimed is:

1. A device for clearing the hole blockage of a liquid resist substrate, the liquid resist substrate having a substrate formed with holes and coated on its upper surface with a liquid resist, the device comprising:
    a pointed nozzle for blowing out portions of said liquid resist in said holes; and
    A funnel-shaped nozzle located proximate to said liquid resist substrate for aspirating said portions of said liquid resist in said holes of said liquid resist substrate.

* * * * *